United States Patent
Pompei

(10) Patent No.: US 8,866,559 B2
(45) Date of Patent: Oct. 21, 2014

(54) HYBRID MODULATION METHOD FOR PARAMETRIC AUDIO SYSTEM

(76) Inventor: Frank Joseph Pompei, Wayland, MA (US)

(*) Notice: Subject to any disclaimer, the term of this patent is extended or adjusted under 35 U.S.C. 154(b) by 255 days.

(21) Appl. No.: 13/049,476

(22) Filed: Mar. 16, 2011

(65) Prior Publication Data

US 2011/0227662 A1     Sep. 22, 2011

Related U.S. Application Data

(60) Provisional application No. 61/314,692, filed on Mar. 17, 2010.

(51) Int. Cl.
*H03C 3/38* (2006.01)
*H03C 5/00* (2006.01)
*H03C 3/00* (2006.01)

(52) U.S. Cl.
CPC ... *H03C 3/00* (2013.01); *H03C 5/00* (2013.01)
USPC ........... 332/145; 332/151; 332/159; 332/149; 382/98; 382/120; 382/97; 704/200; 704/500

(58) Field of Classification Search
USPC .............. 381/98, 120, 97; 332/151, 159, 145, 332/149; 704/200, 500
See application file for complete search history.

(56) References Cited

U.S. PATENT DOCUMENTS 7,729,498 B2 *  6/2010  Spencer et al. .................. 381/77
7,872,545 B2 *  1/2011  Wilhelm ...................... 332/103

OTHER PUBLICATIONS

Gardner, William G., "Efficient Convolution without Input-Output Delay," J. Audio Eng. Soc.43(3), 127-136, 1995.
Wetula, Andrzej, "A Hilbert Transform Based Algorithm for Detection of a Complex Envelope of a Power Grid Signals—an Implementation," J. Power Quality and Utilization, 14(2), 13-18, 2008.
Numerix-Algorithms, "An Envelope Detection Algorithm," www.numerix-dsp.com/envelope.html, Website, 2008.

* cited by examiner

*Primary Examiner* — Arnold Kinkead
(74) *Attorney, Agent, or Firm* — Chapin IP Law, LLC

(57) ABSTRACT

A parametric audio system that permits greater control over the bandwidth of a modulated signal. The system includes a carrier signal generator for generating a carrier signal, at least one audio signal source for generating at least one audio signal, and a modulation component for generating an envelope signal based on the at least one audio signal, modulating the phase of the carrier signal based on a predetermined function to generate a first modulated signal, and multiplying the envelope signal and the first modulated signal to generate a second modulated signal. By selection of the predetermined function, the modulation component can alter the spectrum of the second modulated signal, thereby permitting greater control over the bandwidth of the second modulated signal.

13 Claims, 11 Drawing Sheets

HYBRID MODULATION METHOD FOR PARAMETRIC AUDIO SYSTEM

CROSS REFERENCE TO RELATED APPLICATIONS

This application claims benefit of the priority of U.S. Provisional Patent Application No. 61/314,692 filed Mar. 17, 2010 entitled HYBRID MODULATION METHOD FOR PARAMETRIC AUDIO SYSTEM.

STATEMENT REGARDING FEDERALLY SPONSORED RESEARCH OR DEVELOPMENT

Not applicable

FIELD OF THE INVENTION

The present application relates generally to parametric audio systems, and more specifically to modulation methods for parametric audio systems.

BACKGROUND OF THE INVENTION

The use of dual sideband (DSB) modulation has been shown to be very successful in low-distortion parametric audio systems. In DSB modulation, the signal being processed is simply multiplied by a sinusoid. This results in a fairly wideband signal, with harmonics distributed throughout a wide ultrasound band. In fact, it can be shown that these harmonics extend infinitely across bandwidth, although their levels decrease for frequencies away from the carrier frequency. Therefore, in order to reproduce audible sound with low distortion, one would have to reproduce as much of this spectrum as possible. This requires the use of very broadband transducers and amplifier systems, and the assumption that the transducer and amplifier system has a perfectly flat frequency response (or is corrected by suitable equalization).

However, it is often advantageous to reduce the bandwidth required for the ultrasonic signal. For example, it may be of some advantage to consider a more general form of modulation, which permits greater control over the resulting bandwidth of the modulated signal. While there may be occasional need to expand the bandwidth utilized by a modulated signal, it may be more important in some instances to generate a modulated signal with minimal bandwidth.

BRIEF SUMMARY OF THE INVENTION

In accordance with the present application, a parametric audio system is disclosed that permits greater control over the bandwidth of a modulated signal.

In accordance with one aspect, the parametric audio system includes a carrier signal generator operative to generate a carrier signal, at least one audio signal source operative to generate at least one audio signal, and a modulation component operative to generate an envelope signal based on the at least one audio signal, to modulate the phase of the carrier signal based on a predetermined function to generate a first modulated signal, to multiply the envelope signal and the first modulated signal to generate a second modulated signal, and to alter the spectrum of the second modulated signal by selection of the predetermined function based on the audio signal.

In accordance with another aspect, a method of operating the parametric audio system includes generating a carrier signal, modulating the phase of the carrier signal based on a predetermined function to generate a modulated signal, and altering the spectrum of the modulated signal by selection of the predetermined function.

Other features, functions, and aspects of the invention will be evident from the Drawings and/or the Detailed Description of the Invention that follow.

BRIEF DESCRIPTION OF THE SEVERAL VIEWS OF THE DRAWINGS

The invention will be more fully understood with reference to the following Detailed Description of the Invention in conjunction with the drawings of which.

DETAILED DESCRIPTION OF THE INVENTION

U.S. Provisional Patent Application No. 61/314,692 filed Mar. 17, 2010 entitled HYBRID MODULATION METHOD FOR PARAMETRIC AUDIO SYSTEM, U.S. Provisional Patent Application No. 60/176,140 filed Jan. 14, 2000 entitled PARAMETRIC AUDIO SYSTEM, U.S. Provisional Patent Application No. 60/185,245 filed Feb. 28, 2000 entitled PRE-PROCESSING METHOD FOR NON-LINEAR ACOUSTIC SYSTEMS, U.S. Provisional Patent Application No. 60/328, 516 filed Oct. 9, 2001 entitled ULTRASONIC TRANSDUCER, U.S. Provisional Patent Application No. 60/197, 333 entitled PARAMETRIC AUDIO AMPLIFIER SYSTEM, and U.S. Provisional Patent Application No. 60/233,118 entitled PARAMETRIC ARRAY MODULATION AND PROCESSING METHOD, are hereby incorporated herein by reference in their entirety.

Figure 1:
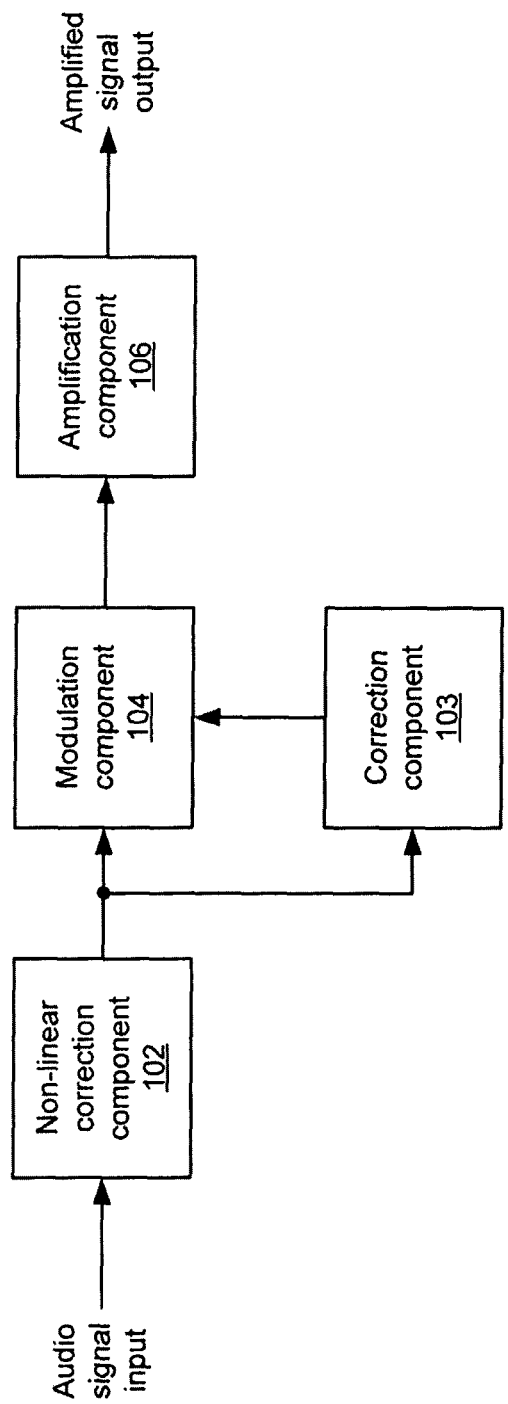
FIG. 1 is a block diagram of an exemplary parametric audio system, in accordance with the present application.

FIG. 1 depicts an illustrative embodiment of a parametric audio system 100, in accordance with the present application. As shown in FIG. 1, the parametric audio system 100 includes a first non-linear correction component 102, a second correction component 103, a modulation component 104, and an amplification component 106. The first non-linear correction component 102 is operative to receive an audio input, and to correct for distortion that may otherwise result in the demodulated signal. For example, the particular algorithm employed by the first non-linear correction component 102 may, for low signal levels, approximate a square root. It is noted, however, that any other suitable algorithm may be employed. The second correction component 103 is operative to take the Hilbert transform of the natural logarithm of the corrected signal from the first non-linear correction component 102. The modulation component 104 is operative to receive the corrected signal from the first non-linear correction component 102, to receive the Hilbert transform of the natural logarithm of the corrected signal from the second correction component 103, to modulate the signal to ultrasound using the respective signals from the first and second correction components 102, 103, and to provide the modulated signal to the amplification component 106. The amplification component 106 is operative to amplify the modulated signal, and to provide the amplified signal as output to one or more acoustic transducers, such as a capacitor transducer, a membrane-type transducer, or any other suitable type of transducer. It is further noted that there may be other intermediate processing steps performed by the parametric audio system 100, such as transducer equalization, audio equalization, feedback features, or any other suitable intermediate processing step(s).

Traditional modulation methods for parametric audio systems are purely AM (amplitude modulation), consisting of a carrier signal multiplied by some particular envelope, which is generally the square root of the offset audio signal. The demodulated signal (e.g., demodulated by the air) is approximately proportional to the second time derivative of the square of the modulation envelope. Traditional single sideband (SSB) modulation has been proposed, but it generally does not provide low-distortion audible results.

For traditional AM modulation, the equation (1) below may be employed, $$y(t) = \alpha(t)\cos(\omega t), \quad (1)$$

in which "$\alpha(t)$" is the envelope calculated from the audio signal to be reproduced, "$\omega$" is the carrier frequency, and "$\cos(\omega t)$" is the carrier signal.

In accordance with the illustrative embodiment of FIG. 1, the modulation component 104 within the parametric audio system 100 is operative to perform a more generalized modulation method that contains both amplitude and phase modulation. The equation for such a modulation method may be expressed as $$y(t) = \alpha(t)\cos[\omega t + \phi(t)], \quad (2)$$

which, in turn, may be expressed in complex notation, as follows:

$$y(t) = Re\{\alpha(t)\exp(i[\omega t + \phi(t)])\}. \quad (3)$$

Accordingly, the modulation method performed by the modulation component 104 may be viewed as a "hybrid" of AM and PM (phase modulation), allowing alteration of the spectral characteristics of the modulated signal without changing the amplitude envelope. Because the envelope itself is unchanged, the signal will demodulate into precisely the desired audio signal. Demodulation in air is approximately a quadratic phenomenon, so when equation (2) above is squared, the audible result is an audible signal proportional to $\alpha^2(t)$, and is unchanged by the presence of $\phi(t)$. It is noted that other ultrasonic components also exist, but as they are inaudible, they are immaterial. The spectrum of the ultrasonic signal can then be adjusted independently of the audible result, by any suitable choice of the phase modulation.

The choice for the function, $\phi(t)$, in equations (2) and (3) above determines the resulting spectrum of the modulated signal. To minimize the bandwidth of the modulated signal, the function, $\phi(t)$, may be expressed as $$\phi(t) = \pm H\{\log[\alpha(t)]\}, \quad (4)$$

in which "$H\{\ \}$" denotes the Hilbert transform, "$\alpha(t)$" is the envelope signal, and "$\log[\alpha(t)]$" is the natural logarithm of the envelope signal. The result is a properly modulated signal having harmonics only on one side of the carrier signal, as well as a finite bandwidth reduced to that comparable to the original audio signal. The choice of "+" or "−" in equation (4) above determines whether the harmonics are of frequencies higher or lower than the carrier signal.

It is noted that any other suitable function, $\phi(t)$, may be employed. For example, while equation (4) above may be an optimal solution for a minimum-bandwidth signal, other choices for the function, $\phi(t)$, could be made to increase bandwidth, perhaps to keep it constant regardless of the incoming signal, or to control and shape the spectrum of the modulated signal to take advantage of particular characteristics of the transducer (e.g., depending on whether the transducer and/or the amplifier was power-limited or amplitude-limited), or to hide distortion components to psychoacoustically masked spectral locations, making them less perceptible. This method of phase manipulation may also be used to create signals which have spectral energy on both sides of the carrier signal, but perhaps in an asymmetrical manner, in contrast to DSB, which is symmetric.

Figure 2:
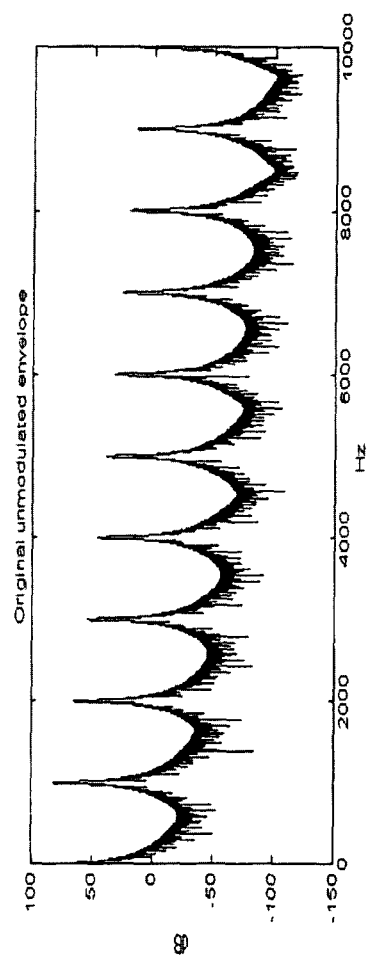
FIG. 2 is a graph illustrating spectra of a first, exemplary, unmodulated envelope signal.
Figure 3A:
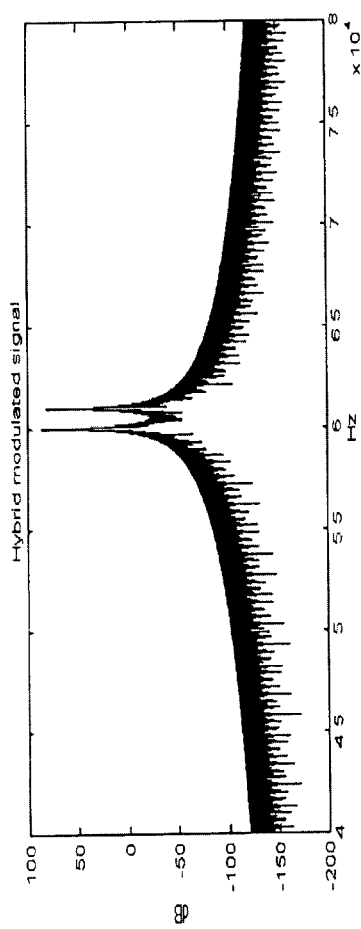
FIG. 3a is a graph illustrating the spectra of the unmodulated envelope signal of FIG. 2, modulated using an exemplary hybrid modulation method performed by the parametric audio system of FIG. 1.
Figure 3B:
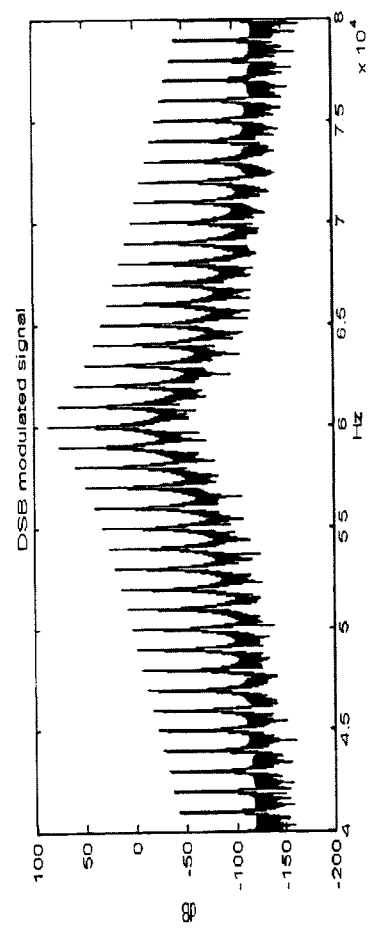
FIG. 3b is a graph illustrating the spectra of the unmodulated envelope signal of FIG. 2, modulated by a traditional DSB approach.
Figure 4A:
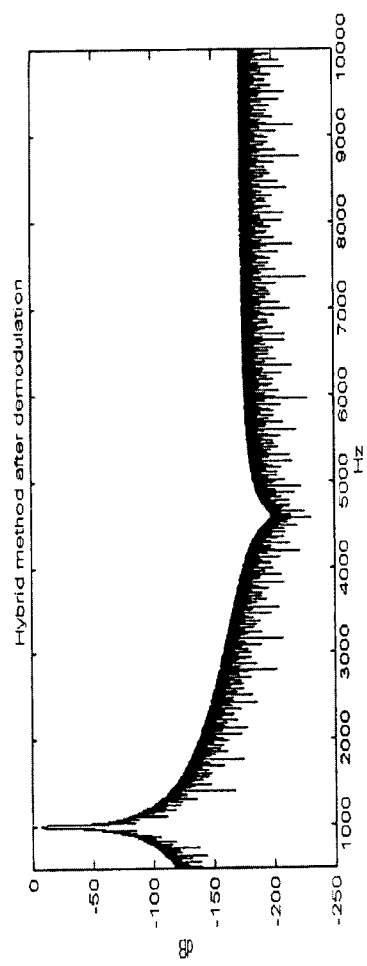
FIG. 4a is a graph illustrating the spectra of the unmodulated envelope signal of FIG. 2, modulated using the hybrid modulation method performed by the parametric audio system of FIG. 1, after demodulation.
Figure 4B:
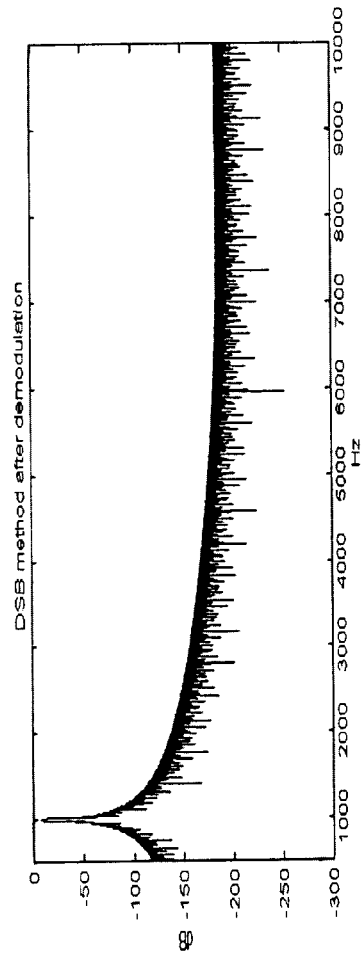
FIG. 4b is a graph illustrating the spectra of the unmodulated envelope signal of FIG. 2, modulated by the traditional DSB approach, after demodulation.

FIGS. 2, 3a-3b, and 4a-4b depict graphs illustrating the spectra of the ultrasonic signals for the presently disclosed hybrid modulation method, as compared to the traditional DSB approach. Specifically, FIG. 2 depicts a graph illustrating the spectra of the original unmodulated envelope signal, which is intended to demodulate into a simple 1 kHz tone; FIGS. 3a-3b depict graphs illustrating the spectra of the signal modulated by the disclosed hybrid modulation method, and the spectra of the signal modulated by the traditional DSB approach, respectively; and, FIGS. 4a-4b depict graphs illustrating the spectra of the signal modulated by the disclosed hybrid modulation method after demodulation, and the spectra of the signal modulated by the traditional DSB approach after demodulation, respectively. The regeneration of a 1 kHz tone is employed. In both cases, the envelope in FIG. 2 is an offset, square rooted sine wave at 1 kHz. The square rooting is intended to compensate for the non-linear distortion which would otherwise result in air during demodulation, which is approximately quadratic.

As shown in FIGS. 4a-4b, the signal is demodulated without distortion in both cases, but note that the spectrum of the hybrid modulated signal (see FIG. 4a) is very narrow. In this case, it is as narrow as the bandwidth of the original audio signal itself. This occurs because the preprocessing is a square root. It is noted that deviations from this approach may make the signal slightly more wideband, but still much less so than DSB. Therefore, for a band-limited reproduction system, there are certainly advantages of using the disclosed hybrid modulation method.

Figure 5:
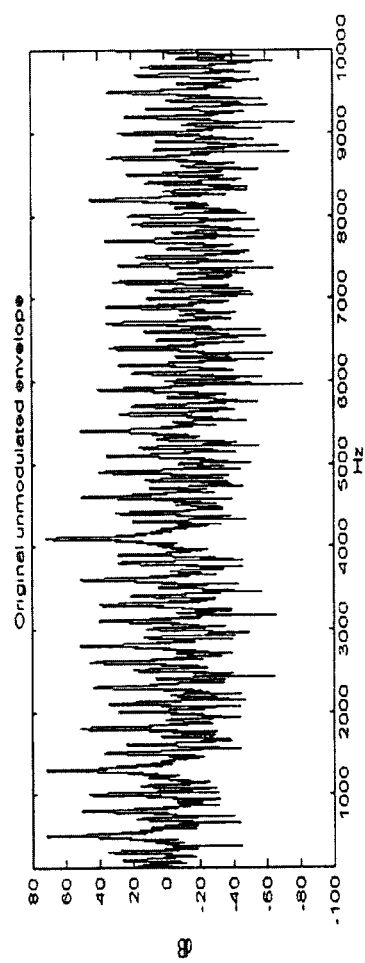
FIG. 5 is a graph illustrating spectra of a second, exemplary, unmodulated envelope signal.
Figure 6A:
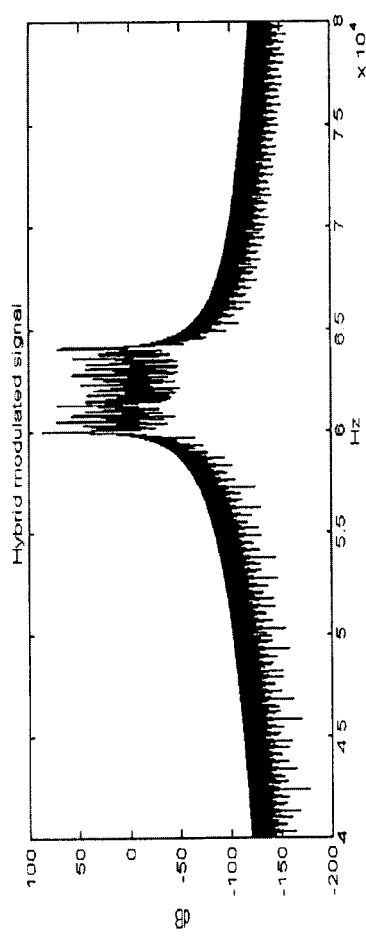
FIG. 6a is a graph illustrating the spectra of the unmodulated envelope signal of FIG. 5, modulated using the hybrid modulation method performed by the parametric audio system of FIG. 1.
Figure 6B:
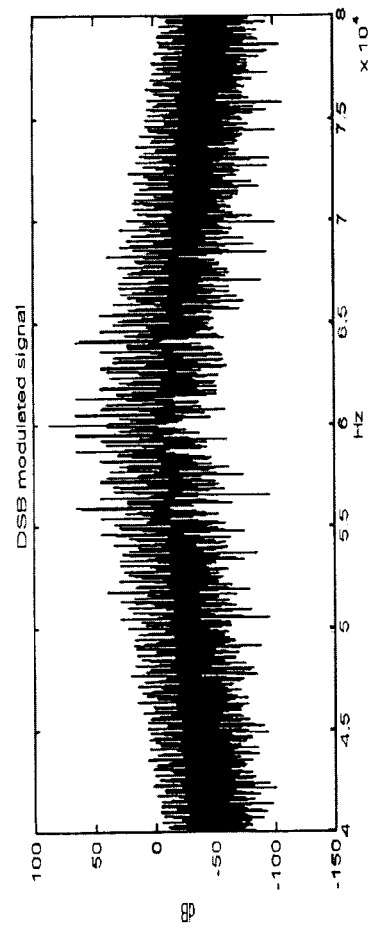
FIG. 6b is a graph illustrating the spectra of the unmodulated envelope signal of FIG. 5, modulated by the traditional DSB approach.
Figure 7A:
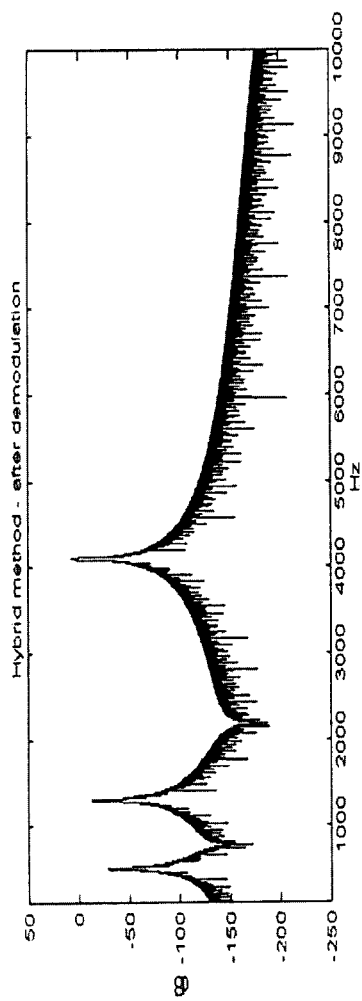
FIG. 7a is a graph illustrating the spectra of the unmodulated envelope signal of FIG. 5, modulated using the hybrid modulation method performed by the parametric audio system of FIG. 1, after demodulation.
Figure 7B:
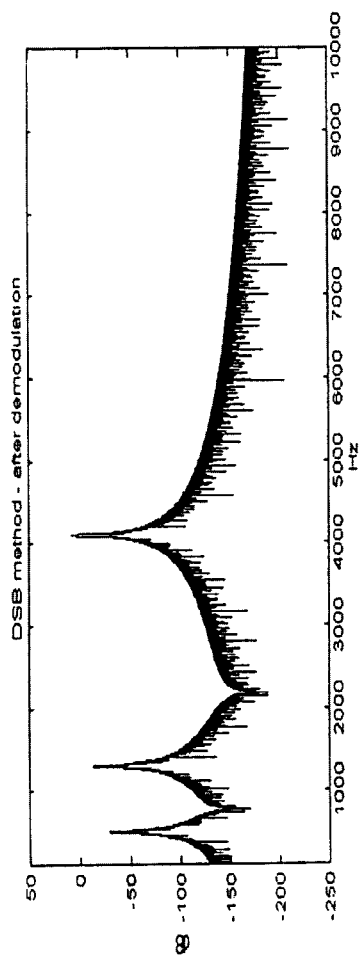
FIG. 7b is a graph illustrating the spectra of the unmodulated envelope signal of FIG. 5, modulated by the traditional DSB approach, after demodulation.

Another benefit of the parametric audio system 100 is that it works with essentially any audio signal. For example, FIGS. 5, 6*a*-6*b*, and 7*a*-7*b* depict graphs illustrating the spectra of a combination of inharmonic tones, e.g., 500 Hz, 1.3 kHz, and 4.1 kHz, to be reproduced together, for the presently disclosed hybrid modulation method, as compared to the traditional DSB approach. Specifically, FIG. 5 depicts a graph illustrating the spectra of the original unmodulated envelope signal; FIGS. 6*a*-6*b* depict graphs illustrating the spectra of the combination of inharmonic tones modulated by the disclosed hybrid modulation method, and the spectra of the combination of inharmonic tones modulated by the traditional DSB approach, respectively; and, FIGS. 7*a*-7*b* depict graphs illustrating the spectra of the combination of inharmonic tones modulated by the disclosed hybrid modulation method after demodulation, and the spectra of the combination of inharmonic tones modulated by the traditional DSB approach after demodulation, respectively. There is a substantial savings in bandwidth by using the disclosed hybrid modulation method, as compared to DSB or SSB, and the reconstruction of the original signal can be achieved with essentially no distortion.

While a square-root preprocessing method has been employed for the signals illustrated in FIGS. 2 and 5, it should be noted that any other suitable preprocessing scheme (which, preferably more accurately inverts distortion from demodulation in air that would otherwise result) may be employed.

It should also be noted that traditional SSB modulation generally does not result in a distortion-free reconstruction of the signal. For example, a SSB signal is traditionally synthesized, as follows, $$y(t) = \frac{1}{2}[x(t)\cos\omega_c t - \hat{x}(t)\sin\omega_c t], \quad (5)$$

in which "$x(t)$" is the modulation envelope, "$\hat{x}(t)$" is the Hilbert transform of the modulation envelope, and "$\omega_c$" is the carrier frequency. Squaring the expression of equation (5), the following is obtained:

$$y^2(t) = \frac{1}{4}[x^2\cos^2\omega_c t + \hat{x}^2\sin^2\omega_c t - 2x\hat{x}\cos\omega_c t\sin\omega_c t] \quad (6)$$
$$= \frac{1}{4}\left[\frac{1}{2}x^2(1+\cos 2\omega_c t) + \frac{1}{2}\hat{x}^2(1-\cos 2\omega_c t) - x\hat{x}\sin 2\omega_c t\right]$$

Dropping the high-frequency (inaudible ultrasonic) terms, equation (6) may be expressed as $$y^2(t) \propto x^2 + \hat{x}^2. \quad (7)$$

So, if standard preprocessing is employed for "$g(t)$" as a normalized audio signal, in which $$x(t) = (1+g(t))^{1/2}, \quad (8)$$

then the demodulated result is approximately as follows, $$p_2(t) \propto g(t) + e(t), \text{ where } e(t) = [H\{[1+g(t)]^{1/2}\}]^2. \quad (9)$$

The error term, $e(t)$, in equation (9) above is the square of the Hilbert transform of the preprocessed signal. If raising a term to an exponent associative with taking a Hilbert transform, e.g., if $(H[x])^2 = H[x^2]$, this may be acceptable, although the error term, $e(t)$, would be 90 degrees out-of-phase with the original, desired signal. While such a method of SSB may work for a single tone when square rooting is not used, it may not work for tone mixtures, or when non-linear preprocessing is employed. Thus, SSB modulation is not a scheme that can be generalized for processing.

Figure 8:
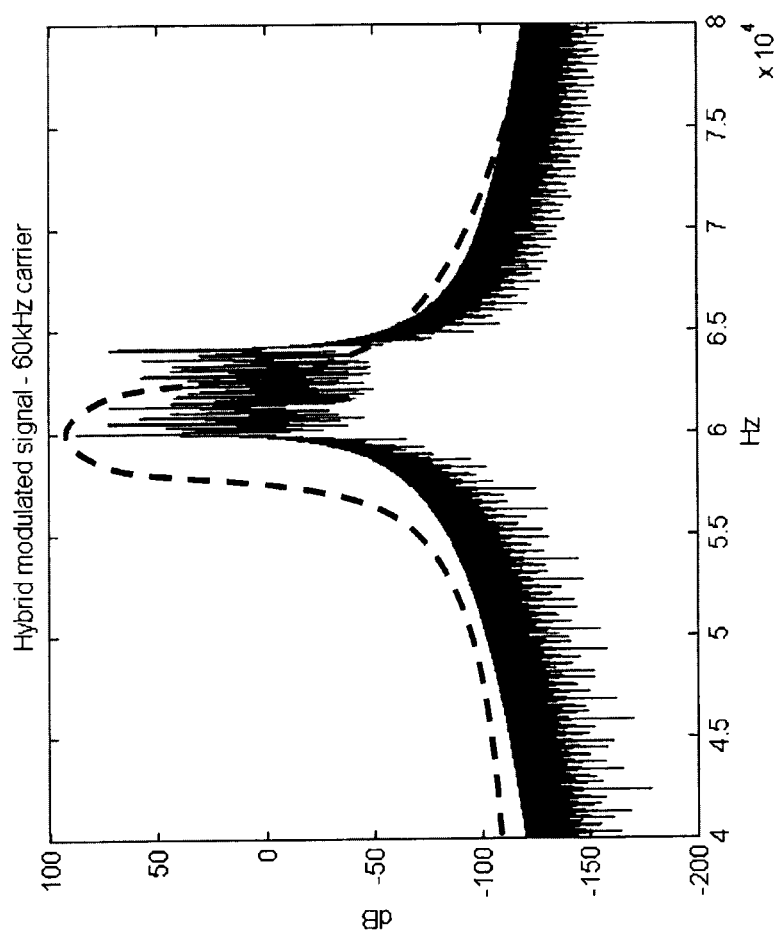
FIG. 8 is a graph illustrating exemplary spectra resulting from the hybrid modulation method being used with a carrier signal of 60 kHz.
Figure 9:
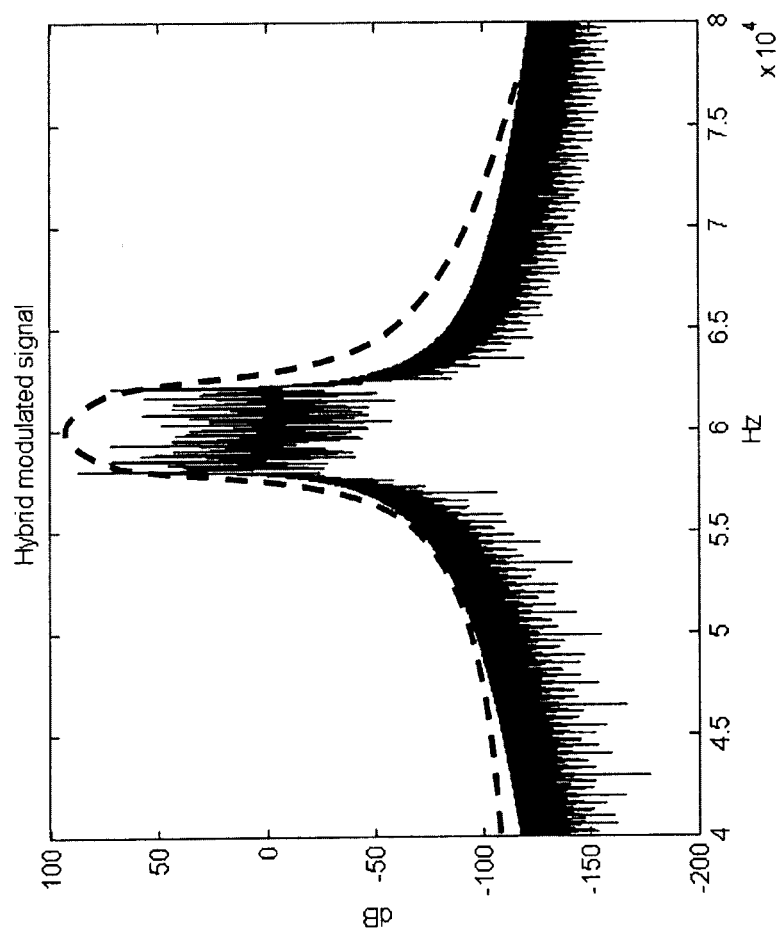
FIG. 9 is a graph illustrating the spectra of FIG. 8 with the frequency of the carrier signal adjusted to coincide with the center of a desired spectrum.

Another technique that may be employed involves the adjustment of the effective center of the bandwidth of the modulated signal to match the characteristics of the transducer and/or the amplifier. For example, if the presently disclosed hybrid modulation method is used with a carrier frequency of 60 kHz, then the spectrum illustrated in FIG. 8 may be obtained. For such a signal to be reproduced accurately, a transducer capable of reproducing ultrasound between approximately 60 kHz and 64 kHz would typically be required. If the transducer response was symmetric about 60 kHz (see the dashed line in FIG. 8), this would be a sub-optimal choice of carrier frequency. Therefore, particularly when using narrowband transducers, it is beneficial to adjust the frequency of the carrier signal to coincide with the center of the desired spectrum, for example, 58 kHz, as depicted in FIG. 9. Essentially all of the ultrasonic spectrum is within the narrow bandwidth of the transducer.

It is noted that additional equalization can be used to compensate for the non-flat amplitude response, or the non-uniform phase response of the transducer and/or the amplifier. An optimal choice of carrier frequency typically depends on the spectrum of the signal to be reproduced. In general, it is desirable to have the carrier frequency exist somewhere near to center of the spectrum to be reproduced, depending on the transducer response characteristics.

There are several approaches to optimizing the choice of carrier frequency. For optimizing distortion, it is desirable to choose a carrier frequency that captures as much of the spectrum width as possible. For optimizing output, it is desirable to choose a carrier frequency that captures as much of the spectral energy as possible.

It is also possible to assume that the incoming audio spectrum is primarily in some specific range, for example, about 400 Hz to 4 kHz (for speech), and to choose the carrier frequency accordingly (the carrier frequency, in this case, would tend to be near the edge of the pass-band of the transducer rather than the center, as is customary). Upper or lower sidebands may be used, as well, depending on the characteristics of the transducer. These modifications to the presently disclosed hybrid modulation method may be available to the user in the form of a selector control.

Both approaches can be implemented similarly, preferably with some sort of spectral estimation technique, coupled to a carrier frequency adjustment system. The carrier frequency should not be allowed to change excessively quickly, as doing so may cause audible distortion. It is therefore preferred to allow the carrier frequency to move, essentially be modulated by a spectral estimate, which is low-pass filtered to be below the practical audio range of the device (e.g., less than 100 Hz). This modification in carrier frequency to permit centering is applicable to any modulation scheme, not only the disclosed hybrid modulation method. It is especially useful with SSB signals.

Accordingly, with the carrier frequency adjustment, a three-part hybrid modulation method for a parametric audio system is provided, including AM, FM (frequency modulation), and PM characteristics, as follows:

$$y(t) = \alpha(t)\cos[\omega(t)t + \phi(t)], \quad (10)$$

in which "ω(t)" is the slowly-varying carrier frequency, varying in response to the incoming signal's bandwidth. It is noted that ω(t) and φ(t) in equation (10) may be combined mathematically, but this is largely for implementation convenience and would essentially be mathematically equivalent. It is further noted that ω(t) does not necessarily need to be slow-moving, only chosen to be a scheme that does not introduce objectionable audible artifacts. For example, ω(t) may be chosen such that it depends on spectral estimation.

It is further noted that variations of the presently disclosed hybrid modulation method may be made. However, any variation producing the correct output result would be essentially mathematically equivalent to the hybrid modulation method disclosed herein. Several features of the disclosed hybrid modulation method are as follows:

1) The modulation effectively becomes complex, having a nontrivial phase component based on the modulation envelope that is not present when using DSB or SSB.

2) The phase component may be used to construct an SSB-like signal, but traditional SSB generally does not work, as its demodulation components are a highly distorted version of the original audible sound, and the spectrum remains infinite/broad.

3) The implementation of the parametric audio system 100 could be done using the disclosed hybrid modulation method, as described above (multiplying by a phase component as described), or by any other suitable mathematical method giving a similar result.

4) Based on the choice for the phase-modulation term, the harmonics could be above the carrier frequency, below the carrier frequency, or on both sides of the carrier frequency.

5) The traditional modulation envelope is modulated by a complex phase term.

In addition, the Hilbert transform can be implemented in several ways, but the use of a properly designed FIR filter (finite impulse response) is preferred, or its analog circuitry equivalent (or similar method), as the phase response is most accurate throughout the transition bands. It is noted that the Hilbert transform need not be exact; approximation methods generally make the Hilbert transform more practical to implement.

Figure 10:
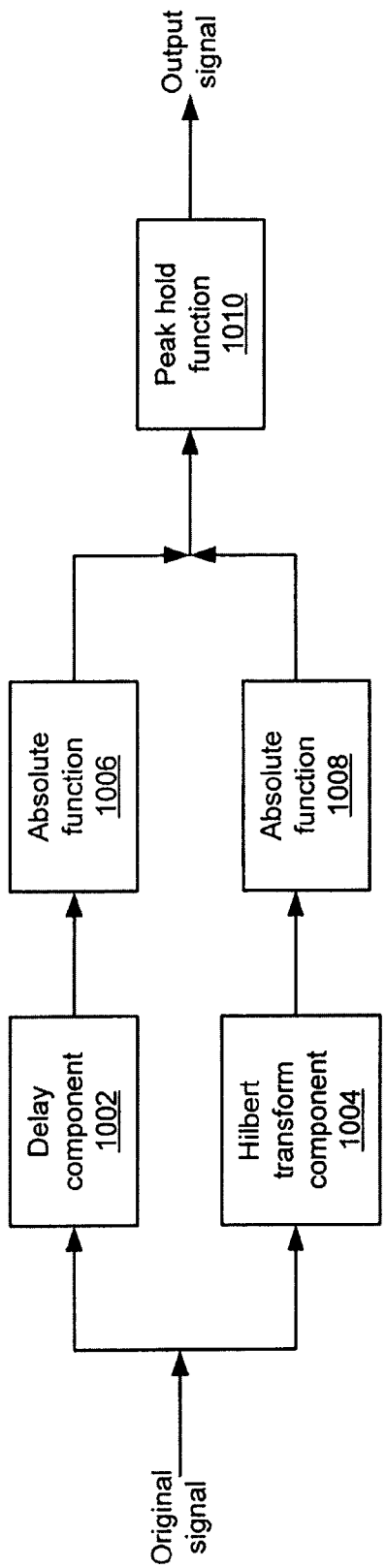
FIG. 10 is a block diagram of an exemplary envelope detection technique based on the Hilbert Transform.

An efficient technique for envelope detection is based on the Hilbert Transform (a 90 degree phase shifter), summing the phase shifted and original signals (see FIG. 10). The Hilbert transform is typically implemented as an FIR filter, so the original signal must be delayed by a delay component 1002 to match the group delay of a Hilbert transform 1004. This process can be followed by absolute functions 1006, 1008, and then a peak hold function 1010; the latter is often implemented as a one pole IIR filter.

Figure 11:
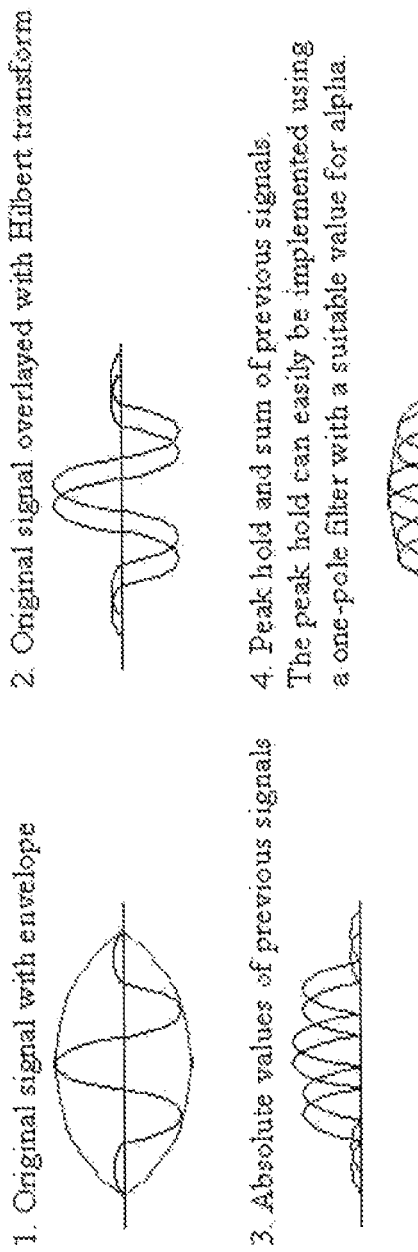
FIG. 11 are graphs illustrating how the envelope detection technique of FIG. 10 operates.

FIG. 11 depicts graphs illustrating how this envelope approximation process based on the Hilbert Transform operates. Specifically, FIG. 11 depicts (1) the original signal with envelope, (2) the original signal overlaid with the Hilbert transform, (3) the absolute values of the previous signals, and (4) the peak hold and sum of the previous. For example, such a peak hold can be implemented using a one-pole filter with a suitable value for alpha, or any other suitable technique.

The following equation (11) shows how the coefficients of the FIR filter implementation of the Hilbert transform are calculated:

$$h(n) = \frac{2}{n*\pi} * \sin^2\left(\frac{n*\pi}{2}\right) \text{ for } n = \pm 1, \pm 2, \pm \frac{N}{2} \quad (11)$$

and $h(0) = 0$ for $n = 0$

The one pole IIR filter is defined by the following equation (12):

$$y(n)=x(n)+a*y(n-1), \text{ where } 0<a<1.0. \quad (12)$$

Equations (11) and (12) above could be used for calculating the envelope of the incoming signal. To use the Hilbert transform for peak detection, and for the presently disclosed hybrid modulation method, the "H(Log(x))" may be employed for envelope detection, and re-translated into a linear scale for offset used with the envelope detection, using, for example, an "exp( )" lookup table.

Efficient techniques of taking the Hilbert transform include streaming DSP processing, approximate FIR/IIR filters, poly-phase filters, analog processing, or any other suitable technique. Block-style convolution may also be employed. The corresponding Hilbert filter could be implemented as an IIR filter, with analog circuitry, or any other suitable implementation. Because the Hilbert filter can be used for both the disclosed hybrid modulation method as well as envelope detection, it would only need to be computed once to be used for both purposes.

Several considerations below may be taken into account for a practical implementation of the presently disclosed hybrid modulation method. With regard to implementing look-up tables for the "exp( )", "log( )", and "sqrt( )" functions, the memory considerations, assuming a 16-bit data space, are as follows:

1) Look-up table for exp( ): 64K
2) Look-up table for log( ): 64K
3) Look-up table for sqrt( ): 64K It is noted that some or all of the look-up tables for the exp( ) log( ) and sqrt( ) functions may be combined, if necessary.

It is further noted that, if at least one integrated circuit chip including at least one processor and at least one memory is employed to implement the processing required for the disclosed hybrid modulation method, then the envelope detection function may be implemented either inside or outside of the chip, e.g., using analog circuitry such as a rectifier/abs circuit and a low-pass filter, and feeding the output to a 10-bit A/D on a peripheral interface controller (PIC). Further, the PIC can delay the input by the group delay of the low-pass filter used for envelope detection.

It will be appreciated that the terms and expressions employed herein are used as terms of description and not of limitation, and there is no intention, in the use of such terms and expressions, of excluding any equivalents of the features shown and described or portions thereof.

It will be further appreciated by those skilled in the art that modifications to and variations of the above-described systems and methods may be made without departing from the inventive concepts disclosed herein. Accordingly, the disclosure should not be viewed as limited except as by the scope and spirit of the appended claims.

What is claimed is:

1. A method of modulating a carrier signal in a parametric audio system, comprising the steps of:
    generating an envelope signal based on at least one audio signal;
    generating the carrier signal, the carrier signal having a carrier frequency;
    modulating the phase of the carrier signal based on a predetermined function to generate a first modulated signal;
    multiplying the envelope signal and the first modulated signal to generate a second modulated signal, the second modulated signal having an associated spectrum;
    altering the spectrum of the second modulated signal by selection of the predetermined function; and amplifying the second modulated signal to generate an amplified signal, wherein the method further includes:

taking the natural logarithm of the envelope signal; and taking at least an approximate Hilbert transform of the natural logarithm of the envelope signal to generate the predetermined function.

2. A method of modulating a carrier signal in a parametric audio system, comprising the steps of:

generating an envelope signal based on at least one audio signal;

generating the carrier signal, the carrier signal having a carrier frequency;

modulating the phase of the carrier signal based on a predetermined function to generate a first modulated signal;

multiplying the envelope signal and the first modulated signal to generate a second modulated signal, the second modulated signal having an associated spectrum;

altering the spectrum of the second modulated signal by selection of the predetermined function, wherein the parametric audio system includes at least one acoustic transducer, and wherein the at least one acoustic transducer has associated response characteristics; and adjusting the carrier frequency to match the response characteristics of the at least one acoustic transducer.

3. A method of modulating a carrier signal in a parametric audio system, comprising the steps of:

generating an envelope signal based on at least one audio signal;

generating the carrier signal, the carrier signal having a carrier frequency;

modulating the phase of the carrier signal based on a predetermined function to generate a first modulated signal;

multiplying the envelope signal and the first modulated signal to generate a second modulated signal, the second modulated signal having an associated spectrum;

altering the spectrum of the second modulated signal by selection of the predetermined function, wherein the parametric audio system includes at least one acoustic transducer, and wherein the at least one acoustic transducer has an associated pass-band; and selecting the carrier frequency based at least on the passband of the at least one acoustic transducer.

4. A method of modulating a carrier signal in a parametric audio system, comprising the steps of:

generating an envelope signal based on at least one audio signal;

generating the carrier signal, the carrier signal having a carrier frequency;

modulating the phase of the carrier signal based on a predetermined function to generate a first modulated signal;

multiplying the envelope signal and the first modulated signal to generate a second modulated signal, the second modulated signal having an associated spectrum;

altering the spectrum of the second modulated signal by selection of the predetermined function, wherein the parametric audio system includes at least one acoustic transducer, wherein the at least one acoustic transducer has an associated bandwidth, and wherein the second modulated signal has an associated bandwidth; and selecting the carrier frequency such that the bandwidth of the second modulated signal coincides with the bandwidth of the at least one acoustic transducer.

5. The method of claim 1 further comprising amplifying the second modulated signal to generate an amplified signal, wherein the amplified signal has an associated bandwidth, wherein the at least one audio signal has an associated bandwidth, and wherein the bandwidth of the amplified signal is comparable to the bandwidth of the at least one audio signal.

6. A method of modulating a carrier signal in a parametric audio system, comprising the steps of:

generating an envelope signal based on at least one audio signal;

generating the carrier signal, the carrier signal having a carrier frequency;

modulating the phase of the carrier signal based on a predetermined function to generate a first modulated signal;

multiplying the envelope signal and the first modulated signal to generate a second modulated signal, the second modulated signal having an associated spectrum;

altering the spectrum of the second modulated signal by selection of the predetermined function, wherein the carrier signal is a modulated carrier signal, and wherein the modulated carrier signal has an associated bandwidth; and performing equalization of the second modulated signal within the bandwidth of the modulated carrier signal.

7. A parametric audio system, comprising:

a carrier signal generator operative to generate a carrier signal, the carrier signal having a carrier frequency;

at least one audio signal source operative to generate at least one audio signal; and a modulation component operative:

to generate an envelope signal based on the at least one audio signal;

to modulate the phase of the carrier signal based on a predetermined function to generate a first modulated signal;

to multiply the envelope signal and the first modulated signal to generate a second modulated signal, the second modulated signal having an associated spectrum;

to alter the spectrum of the second modulated signal by selection of the predetermined function;

to take the natural logarithm of the envelope signal, and to take at least an approximate Hilbert transform of the natural logarithm of the envelope signal to generate the predetermined function.

8. The system of claim 7 further comprising an amplification component operative to amplify the second modulated signal to generate an amplified signal.

9. The system of claim 8 wherein the amplified signal has an associated bandwidth, wherein the at least one audio signal has an associated bandwidth, and wherein the bandwidth of the amplified signal is comparable to the bandwidth of the at least one audio signal.

10. A parametric audio system, comprising:

a carrier signal generator operative to generate a carrier signal, the carrier signal having a carrier frequency;

at least one audio signal source operative to generate at least one audio signal;

a modulation component operative:

to generate an envelope signal based on the at least one audio signal;

to modulate the phase of the carrier signal based on a predetermined function to generate a first modulated signal;

to multiply the envelope signal and the first modulated signal to generate a second modulated signal, the second modulated signal having an associated spectrum; and to alter the spectrum of the second modulated signal by selection of the predetermined function, wherein the carrier signal has an associated bandwidth; and an equalization component operative to perform equalization of the second modulated signal within the bandwidth of the carrier signal.

11. A parametric audio system, comprising:

a carrier signal generator operative to generate a carrier signal, the carrier signal having a carrier frequency;

at least one audio signal source operative to generate at least one audio signal;

a modulation component operative:

to generate an envelope signal based on the at least one audio signal;

to modulate the phase of the carrier signal based on a predetermined function to generate a first modulated signal;

to multiply the envelope signal and the first modulated signal to generate a second modulated signal, the second modulated signal having an associated spectrum; and to alter the spectrum of the second modulated signal by selection of the predetermined function;

at least one acoustic transducer, wherein the at least one acoustic transducer has an associated bandwidth, wherein the second modulated signal has an associated bandwidth; and a selector control operative to select the carrier frequency such that the bandwidth of the second modulated signal coincides with the bandwidth of the at least one acoustic transducer.

12. A method of modulating a carrier signal in a parametric audio system, comprising the steps of:

nonlinearly-processing an audio signal;

taking the logarithm of the nonlinearly-processed audio signal;

calculating the Hilbert Transform of the logarithm of the nonlinearly-processed audio signal to generate an intermediate signal;

modulating the carrier signal to generate a modulated signal, the modulated signal having a bandwidth; and adjusting the bandwidth of the modulated signal using the intermediate signal as a phase modulation component.

13. A method of modulating a carrier signal in a parametric audio system, comprising the steps of:

amplitude-modulating the carrier signal with an envelope based on an audio signal to be reproduced to generate a modulated signal, and phase-modulating the carrier signal or the modulated signal with a time-varying phase component based on the audio signal to be reproduced, the phase-modulating of the carrier signal or the modulated signal including taking the Hilbert transform of the logarithm of the amplitude-modulated signal.

* * * * *